United States Patent [19]

Nebe et al.

[11] Patent Number: 5,260,163
[45] Date of Patent: Nov. 9, 1993

[54] PHOTOENHANCED DIFFUSION PATTERNING FOR ORGANIC POLYMER FILMS

[75] Inventors: William J. Nebe; John K. Holzapfel, both of Wilmington, Del.

[73] Assignee: E. I. Du Pont de Nemours and Company, Wilmington, Del.

[21] Appl. No.: 880,090

[22] Filed: May 7, 1992

[51] Int. Cl.$^5$ .......................... G03C 11/00; G03F 7/38
[52] U.S. Cl. .................................... 430/198; 430/325; 430/327; 430/330; 430/273
[58] Field of Search ............... 430/325, 327, 198, 330, 430/273

[56] References Cited

U.S. PATENT DOCUMENTS

| | | | |
|---|---|---|---|
| 4,410,562 | 10/1983 | Nemoto et al. | 430/327 |
| 4,429,027 | 1/1984 | Chambers, Jr. et al. | 430/5 |
| 4,613,560 | 9/1986 | Dueber et al. | 430/286 |
| 5,032,216 | 7/1991 | Felten | 156/628 |

FOREIGN PATENT DOCUMENTS

62-54253 of 1987 Japan .

*Primary Examiner*—Christopher D. Rodee

[57] ABSTRACT

1. A method for making patterns in organic polymer films comprising the following steps:
   (a) applying to a substrate an unpatterned photosensitive first layer comprising (a1) an organic polymeric binder, (a2) an ethylenically unsaturated monomer and (a3) a photoinitiating system;
   (b) applying to the photosensitive first layer a second patterning layer comprising (b1) radiation-opaque material which prevents the transmission of actinic radiation and (b2) a diffusing agent which is capable of changing the dispersibility of the photosensitive material in a predetermined eluant;
   (c) exposing the first photosensitive layer to actinic radiation to effect photohardening of the photosensitive first layer in those areas not covered by the second patterning layer;
   (d) effecting patterned diffusion of the diffusing agent into the underlying first photosensitive layer; and
   (e) removing the areas of the first photosensitive layer which are dispersible in the predetermined eluant, by washing them with the eluant; wherein step (c) is carried out before, after or simultaneously with step (d).

18 Claims, 2 Drawing Sheets

PHOTOENHANCED DIFFUSION PATTERNING FOR ORGANIC POLYMER FILMS

FIELD OF THE INVENTION

This invention is directed to a diffusion patterning process for organic polymer films. More particularly, it is directed to an improved diffusion patterning process using a photosensitive layer.

BACKGROUND OF THE INVENTION

Multilayer thick film circuits have been used for many years to increase circuit functionality per unit of area. Moreover, recent advances in circuit technology have placed new demands on dielectrics, conductors and resistors for this use. These are conventionally thick film materials which are applied to substrates by screen printing in the desired pattern. The material is then heated, i.e., "fired," to burn out all the organic materials and sinter the inorganic materials. The problem with this approach has been the limited resolution capability of thick film screen printing. Typically, it is difficult to obtain better than 8 mil (200 micrometer) line and space resolution or better than 10-15 mil (250-375 micrometer) diameter via holes.

An alternative approach is to use photosensitive materials. The polymeric material is applied to the substrate in a photosensitive medium comprising a monomer, a binder and a photoinitiator. The layer is then exposed to actinic radiation in an imagewise pattern, i.e., through a phototool, and developed to remove the unexposed areas. For electronic applications, the photosensitive layer also contains the functional material, i.e., dielectric, conductor or resistor. After development of this layer, it is fired as described above. However, there are problems getting adequate contact between the photosensitive layer and the phototool without having the phototool scratch the surface of the photosensitive layer. The photosensitive materials generally require development by organic solvents, which may result in handling and waste disposal difficulties. In addition, the photoinitiators which are used in photosensitive compositions are frequently sensitive to the room light. Thus, these materials must be handled in a yellow light environment to prevent photohardening initiated by room light.

This difficulty can be overcome using a diffusion patterning process as disclosed by Felten in U.S. Pat. No. 5,032,216. In this method, a first layer of nonphotosensitive polymeric material is applied to a substrate in an unpatterned manner, followed by a second nonphotosensitive layer in a pattern. The second, patterning layer diffuses down to the first layer effecting a change in the dispersibility of that layer. The first layer is then removed in those areas which have greater dispersibility. Again, for electronic applications, the functional material is contained in the first layer, which is fired after development.

While diffusion patterning is versatile, fast and economical, it does have some limitations. In particular, the diffusing material has a tendency to spread in the X-Y direction as it diffuses in the Z direction (vertically). This leads to a loss in resolution and makes it difficult to make very small via holes or other openings.

There exists a need, therefore, for an improved process for making very fine patterns in organic polymer films, for use in electronic applications. In addition, it would be desirable to have materials which can be developed in aqueous solutions or in water alone.

SUMMARY OF THE INVENTION

The invention is therefore directed to a method for making patterns in organic polymer films comprising the following steps:

(a) applying to a substrate an unpatterned photosensitive first layer comprising (1) an organic polymeric binder, (2) an ethylenically unsaturated monomer, and (3) a photoinitiating system;

(b) applying to the photosensitive first layer a second patterning layer comprising (1) a radiation-opaque material which prevents the transmission of actinic radiation and (2) a diffusion agent which is capable of changing the dispersibility of the photosensitive first layer in a predetermined eluant;

(c) exposing the photosensitive first layer to actinic radiation to effect photohardening of the layer in those areas not covered by the second patterning layer;

(d) effecting patterned diffusion of the diffusing agent into the underlying first photosensitive layer; and (e) removing the areas of the first photosensitive layer which are dispersible in the predetermined eluant, by washing them with the eluant; wherein step (c) is carried out before, after or simultaneously with step (d).

Definitions

As used herein the following terms have the meanings indicated below.

The term "eluant" refers to any fluid, either liquid or gaseous, which is capable of dissolving or otherwise placing the underlying photosensitive first layer into a dispersible form.

The term "dispersible" means with respect to a layer or film of given material, that the material is capable of being displaced or removed by physical or chemical action of a wash liquid or by lifting off.

The term "photohardenable" refers to material the dispersibility of which is decreased when it is exposed to actinic radiation. The decrease in dispersibility can be due to polymerization reactions, cross-linking reactions or combinations of the two.

The term "volatile solvent" means any solvent which can be removed by evaporation at a temperature of 120° C. or less at one atmosphere of pressure.

Removal of diffusion-patterned areas of the underlying photosensitive first layer may take place by several mechanisms such as the following:

(1) dissolving the photosensitive material within the diffusion-patterned areas in a solvent and washing off the thusly formed polymer solution;

(2) decomposing the photosensitive material within the diffusion-patterned areas and washing and/or evaporating off the decomposition products;

(3) emulsifying the photosensitive material within the diffusion-patterned areas with a detergent and removing the dispersion with an aqueous wash fluid;

(4) softening the photosensitive material within the diffusion-patterned areas to reduce its adhesion to the substrate by solvent and/or plasticizing action and lifting off the softened material from the substrate;

(5) swelling the photosensitive material within the diffusion-patterned areas to reduce its adhesion to the substrate by solvent and/or plasticizing action and lifting off the softened material from the substrate; and (6) ionizing the photosensitive material within the diffusion-patterned areas and washing the ionized material from the substrate with an aqueous ionic liquid.

BRIEF DESCRIPTION OF THE DRAWING

The Drawing consists of two FIGS., 1A and 1B, which illustrate two methods for conducting the process of the invention.

Figure 1A:
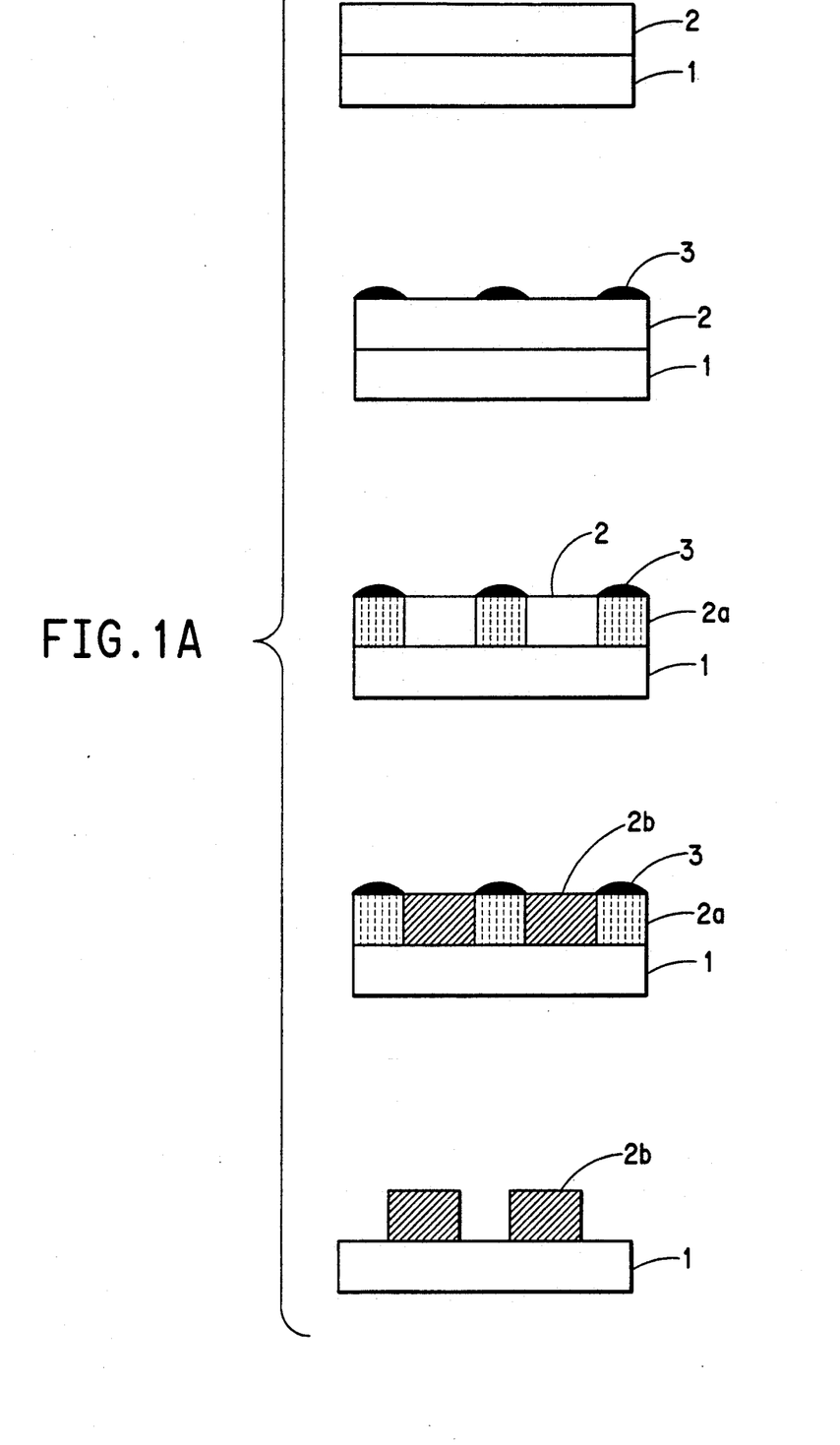
Figure 1B:
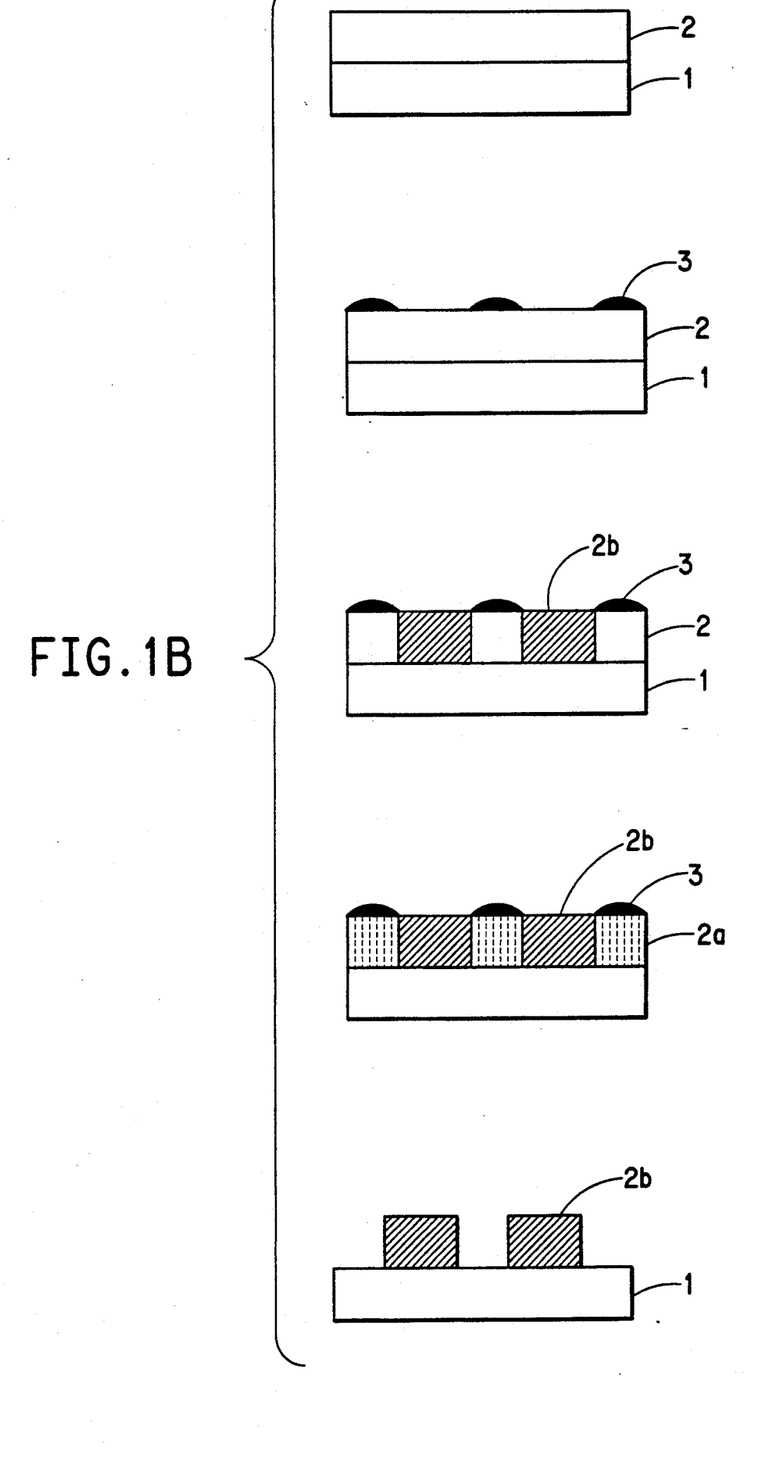

Turning now to the Drawing, FIG. 1A depicts a first method for carrying out the invention in which diffusion of the patterning layer is carried out before exposing the photosensitive first layer. FIG. 1B depicts a second method for carrying out the invention in which diffusion of the patterning layer is carried out after exposing the photosensitive first layer.

As shown in FIG. 1A, an unpatterned photosensitive first layer 2 is applied to substrate 1, after which a pattern of radiation-opaque material 3 containing a diffusing agent is applied to the available surface of the first layer 2. Diffusion of the diffusing agent from the patterning layer 3 into the underlying areas 2a of the first layer 2 is carried out by heating the patterned layer 3. Upon completion of diffusion, the photosensitive layer 2 is exposed to actinic radiation to effect photohardening of the exposed areas 2b of the photosensitive first layer 2, that is, the areas not underlying the pattern of radiation-opaque material 3. The unexposed areas 2a of the first layer 2 and the overlying opaque pattern 3 are removed by washing with an appropriate eluant, leaving a photohardened and patterned first layer 2b.

As shown in FIG. 1B, an unpatterned photosensitive first layer 2 is applied to substrate 1, after which a pattern of radiation-opaque material 3 containing a diffusing agent is applied to the exposed surface of the first layer 2. The available areas 2b of the photosensitive first layer 2, that is, those areas not underlying the pattern of radiation opaque material, are then exposed to actinic radiation to effect photohardening of the available areas 2b of the photosensitive first layer 2, after which diffusion of the diffusing agent from the patterning layer 3 into the photohardened first layer 2 is accomplished by heating the assemblage. Upon completion of the diffusion, the unexposed areas 2a of the first layer 2 and the overlying opaque pattern 3 are removed by washing with an appropriate eluant.

DETAILED DESCRIPTION OF THE INVENTION

The invention relates to a process for forming polymeric layers in patterns. It is particularly suited for making dielectric layers with very small vias for electronic applications. In the process of the invention a first layer of a photosensitive material is applied to a substrate. To this is applied a patterning layer of nonphotosensitive material which prevents the transmission of actinic radiation and further which contains a diffusing agent which increases the dispersibility of the photosensitive material in a predetermined eluant. The composite is then exposed overall to actinic radiation causing photohardening of the photosensitive layer in those areas not covered by the second patterning layer. The agent which increases the dispersibility of the photosensitive material then diffuses into the underlying areas of the photosensitive layer. The diffusion can take place before, during or after the exposure step. This is followed by a development step in which the second patterning layer and the non-polymerized areas of the first photosensitive layer are removed in an eluant.

When the agent which increases the dispersibility of the photosensitive layer diffuses, it has a tendency to spread out in the X-Y direction rather than diffusing strictly in the vertical direction. On the other hand, the photohardening of the photosensitive layer has a tendency to spread beyond the areas exposed to actinic radiation and include the edges of the unexposed areas. In the process of the invention, these two effects are counterbalanced resulting in a more exact pattern duplication than can be achieved with either photosensitive or diffusion patterning systems alone. It has been found that this is true regardless of the order in which the photohardening and diffusion steps are carried out. Thus the exposure (photohardening) step can be carried out before, during or after the diffusion step.

Photosensitive materials are conventionally exposed to actinic radiation through a phototool, i.e. a film having a pattern of opaque areas to prevent the transmission of radiation and clear areas which transmit radiation. However, most phototool materials, e.g., polyester, absorb significant amounts of radiation below 350 nm even in the "clear" areas. Thus, the initiator systems which can be used when these phototools are employed are limited to those which absorb above 350 nm. The process of the invention has additional flexibility because the patterning material which covers the areas which are to be left unexposed to radiation is applied directly to the surface of the photosensitive layer. The areas to be imaged are open and not covered by any material. Thus no radiation is screened and it is possible to use both conventional initiator systems and those sensitive to shorter UV wavelengths. In the latter case, there is the additional advantage that the photosensitive material is white light stable. Thus it can be prepared and handled in later processing steps without the need for yellow light conditions. The activating short wavelengths are not emitted by most white light incandescent and fluorescent bulbs.

I. Process Steps

The first step in the process of the invention is the application of a layer of photosensitive material onto a substrate. The photosensitive material can be applied in the form of either a film or a thick film paste. Film materials generally have a thickness in the range of about 1 mil (0.0025 cm) to 10 mils (0.025 cm) and are applied by lamination. Thick film materials are generally applied by screen printing in the same thickness range. After printing, the thick films are dried at slightly elevated temperatures, typically 50°-100° C.

The next step in the process of the invention is the application of a second patterning layer of nonphotosensitive material over the photosensitive layer. The patterning layer can be applied by a number of different techniques. The exact choice of application method will depend on the nature and properties of the material in the patterned layer. Some application techniques which can be used include screen printing; writing with an ink jet printhead; printing with solid state toners, e.g. by a laser printer; thermal transfer printing; direct writing with a pen on a plotter; and printing with flexographic, gravure or offset printing systems. Many of these application methods can use digitized information so that the design and any alterations of the pattern can be generated by computer. This "digital imaging" technique can be very advantageous with greater speed, flexibility and accuracy.

The thickness of the second patterning layer depends on the method of application and the effective opacity of the material. If too little material is applied it will not be effective as a mask, i.e., it will not prevent actinic radiation from exposing the photosensitive layer underneath the mask. If the patterned layer is too thick it may be difficult to obtain the necessary resolution. When the patterning material is applied by screen printing or printing plate systems, the layer will usually be at least 0.5 mil (0.0013 cm) thick and generally is 1 to 2 mils (0.0025 to 0.005 cm) thick. When the patterned layer is applied by laser printing, thermal transfer or ink jet printer, the layer may be thinner, provided that it has sufficient opacity. It is preferred that the patterning layer provide an optical density of at least 3, as measured by a reflection densitometer.

The next step in the process of the invention is to expose the assembly of substrate, first photosensitive layer and second patterning layer, to actinic radiation. The second patterning layer acts as a mask so that only those areas of the first photosensitive layer which are not covered by the patterning material will be exposed to radiation resulting in photohardening. Because the second patterning layer is printed directly on the surface of the photosensitive layer there are no problems associated with gaps between the phototool and the photosensitive layer. Nor is there any potential to scratch the surface of the photosensitive layer, as when using a separate phototool. Any radiation source emitting radiation having the proper wavelength and adequate intensity can be used. The choice of the radiation source will depend to a large extent on the nature of the photoinitiating system in the photosensitive layer.

The next step in the process of the invention is generally the diffusion of the material from the second patterning layer to the first photosensitive layer. As discussed above, this step can also take place before or during the exposure step. It is frequently more convenient to effect diffusion prior to the exposure step. The diffusion is generally accomplished by drying the second patterning layer at slightly elevated temperatures, typically 50°-100° C., for a few minutes up to several hours.

The next step in the process of the invention is the development of the first photosensitive layer and the removal of the second patterning layer. The photosensitive layer is removed in those areas which have not photohardened, i.e., those areas which were not exposed to actinic radiation, and thus are more dispersible in an eluant. The development step can be carried out using any conventional development technique. For liquid eluants, this includes spraying the eluant on the exposed assembly and immersing the assembly, with or without agitation. The second patterning layer should be completely and quickly removed by the eluant in order to achieve good development of the underlying photosensitive layer.

Suitable liquid eluants for photohardenable layers are well known. The eluant can be an organic solvent, such as an aliphatic or aromatic hydrocarbon or halohydrocarbon, or mixtures of such solvents with suitable alcohols; a semi-aqueous solution, such as a solution of a water-miscible organic solvent and an alkaline material in water; or an aqueous solution, such as a solution of an alkaline salt in water. An advantage of the present invention is that water alone can also be used as the eluant when the diffusing agent reacts with the underlying photosensitive layer to form a water soluble material.

For example, an amine diffusing agent can be used to react with an acid-containing polymer in the photosensitive layer to form a water soluble salt.

After the development step the assembly consists of the substrate and the photohardened areas of the first layer. When the material is to be used in an electronic application, this layer can then be fired to remove the organic materials and sinter the inorganic materials. This can be done for an individual layer, or additional conductor, resistor or dielectric layers can be added to the first layer and the multilayer assembly fired together (cofired).

The heating cycle must be such that first the organic materials are volatilized and then the inorganic materials are sintered. The firing step is usually a two to three hour cycle. The first stage in the firing process is carried out at a temperature below the softening point of the inorganic binder, typically below 500° C. It is during this stage that the organic materials are volatilized. The second stage in the firing process is carried out at a temperature above the softening point of the inorganic binder, typically 800°-1000° C. It is during this stage that the inorganic binder softens and sinters with the ceramic solids.

The atmosphere used for firing will depend on the nature of the inorganic materials used. When the first layer is a dielectric material and is fired as an individual layer, it is preferred that firing take place in an air atmosphere to insure complete oxidation and volatilization of the organic materials. When gold or silver conductor materials are present, the assembly can be fired in air at the temperatures described above, as long as the temperature does not exceed the melting point of the conductor metal. When copper conductor materials are present, an air atmosphere cannot be used for firing because of the undesirable oxidation of copper to copper oxides. In this case the assembly is first fired in a substantially nonoxidizing atmosphere to volatilize the organic materials, and then fired in an essentially nonoxidizing atmosphere for the sintering phase. The term "substantially nonoxidizing" means an atmosphere which contains insufficient oxygen to effect any significant oxidation of copper metal, but which nevertheless contains sufficient oxygen to effect oxidation and volatilization of the organic materials. In practice it has been found that a nitrogen atmosphere of 100-1000 ppm oxygen is appropriate in the presintering phase of the firing step. From 300 to 800 ppm oxygen is preferred. The term "essentially nonoxidizing" means an inert atmosphere containing only residual amounts of oxygen. In practice it has been found that a nitrogen atmosphere having 100 ppm oxygen or less is appropriate for the sintering phase of the firing step.

II. Materials

A. Substrate

The method of the invention can be used on either inorganic substrates, such as $Al_2O_3$, $SiO_2$, silicon AlN and the like, or organic substrates, such as polyimides, phenoxy resins, epoxy resins and the like, or composite substrates, such as filled organic polymers.

B. Photosensitive Layer

The photosensitive layer comprises (1) an organic polymeric binder, (2) an ethylenically unsaturated monomer and (3) a photoinitiating system. For electronic applications, the photosensitive layer additionally comprises (4) finely divided particles of functional material, i.e., dielectric, conductor or resistor solids, (5) an inorganic binder and (6) an organic solvent. For any application, the photosensitive layer can also comprise (7) additional additives.

1. Polymeric Binder

The polymeric binder is important in the processing of the photosensitive layer, i.e., the development step. Irrespective of the way in which it is formed, the binder must be film-forming, noncrystalline and must interact with the diffusing agent from the second patterning layer in such a way that its dispersibility is increased in a predetermined eluant. Types of binders which can be used include polymeric materials whose dispersibility is increased by the action of a plasticizer; polymeric materials having acidic groups which form water-soluble salts with basic compounds; polymeric materials with acid-degradable groups; polymeric materials which are emulsifiable by detergents; and polymeric materials which undergo catalytic decomposition.

Examples of polymeric materials which are plasticizable include homopolymers and copolymers of the following monomers: alkyl acrylates and methacrylates; styrene; mono-olefins, such as ethylene and propylene; vinyl compounds, such as vinyl chloride, vinyl acetate and vinylbutyrate. Cellulosic resins, such as ethyl cellulose, cellulose acetate, cellulose nitrate and cellulose acetate butyrate, can also be used.

Examples of polymeric materials having acidic groups include copolymers of ethylenically unsaturated acids, such as acrylic acid, fumaric acid, vinyl sulfonic acid, itaconic acid, methacrylic acid, crotonic acid and the like; styrene maleic anhydride copolymers; and cellulose derivatives. The chemical nature of the polymer backbone is not of itself important so long as the polymer is (1) non-crystalline, (2) film-forming and (3) contains enough acidic groups so that it will undergo sufficient ionization upon exposure to basic solutions to become soluble in the eluant. It is preferred that the acid-containing monomer be present in the copolymer in an amount of at least 10% by weight of the copolymer. A particular advantage of these systems is that the eluant can be water alone.

Examples of polymeric materials having acid-degradable groups include the polymeric materials described above as plasticizable in which there are also acid degradable groups. Examples of suitable acid degradable groups include esters, carbonates, acetal, ketals, and the like. The acid-degradable groups can be in the polymeric backbone, in pendant groups, or in cross-linkages.

Examples of emulsifiable polymeric materials include cellulosic resins, such as ethyl cellulose, cellulose acetate, cellulose nitrate and cellulose acetate butyrate.

Examples of polymeric materials which undergo catalytic decomposition include homopolymer and copolymers of acrylates, methacrylates, and styrene.

The amount of binder present in the photosensitive layer depends on the intended use for the material. For electronic applications, the binder is generally present in an amount of 5–60% by weight, based on the total weight of the inorganic solids. For other applications, the binder concentration is generally in the range of 10–95% by weight, based on the total weight of the dry photohardenable layer.

2. Monomer

The monomer component of the photosensitive layer is comprised of at least one addition polymerizable ethylenically unsaturated compound having at least one polymerizable ethylenic group. Such compounds are capable of forming a high polymer by free radical initiated, chain propagating addition polymerization. The monomers can also crosslink with binders in which there is residual unsaturation. The monomeric compounds are nongaseous, i.e., they have a normal boiling point above 100° C. and a plasticizing action on the organic polymeric binder.

Suitable monomers which can be used alone or in combinations with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxethyl-2,2-di-(p-hydroxyphenyl)propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Preferred monomers are polyoxyethylated trimethylolpropane triacrylate, ethylated pentaerythritol triacrylate, dipentaerythritol monohydroxypentaacrylate and 1,10-decanediol dimethylacrylate. Other preferred monomers are monohydroxypolycaprolactone monoacrylate, polyethyleneglycol diacrylate or dimethacrylate (mol. wt. approximately 200, 400, 600 or 800).

The unsaturated monomeric component is present in an amount of 5 to 45% by weight based on the total weight of the dry photohardenable layer.

3. Photoinitiating System

Suitable photoinitiation systems are those which are thermally inactive but which generate free radicals upon exposure to actinic light at or below 185° C. In addition to conventional photoinitiation systems, the photoiniatiation systems which can be used in the process of the invention include those which are sensitive to actinic radiation having a wavelength less than 350 nm. These photoinitiation systems will not initiate photohardening in room light. This makes it possible to handle and process the materials without having to use yellow-light conditions.

Examples of suitable photoinitiation systems include the substituted or unsubstituted polynuclear quinones which are compounds having two intracyclic carbon atoms in a conjugated carbocyclic ring system, e.g., 9,10-anthraquinone, and 9-10-phenanthrenequinone. Other photoinitiators which are also useful are described in U.S. Pat. No. 2,760,863 and include xanthone and isopropylthioxanthone; 4-benzyl-4'-methyldiphenylsulfide; ethyl-4-(dimethylamino)benzoate; 2,2-dimethoxy-2-phenylacetophenone; (4-benzoylbenzyl) trimethylammonium chloride; vicinal ketaldonyl alcohols such as benzoin, and benzoin methyl and ethyl ethers; $\alpha$-hydrocarbon-substituted aromatic acyloins, including methylbenzoin. Photoreducible dyes and reducing agents disclosed in e.g., U.S. Pat. No. 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos., 3,427,161, 3,479,185, and 3,549,367 can be used as initiators. Also useful with photoinitiators and photoinhibitors are sensitizers disclosed in U.S. Pat. No. 4,162,162.

The photoinitiator or photoinitiator system is present in the amount of 0.05 to 10% by weight based on the total weight of the dry photohardenable layer.

4. Functional Solids

For electronic applications the photosensitive layer will also contain electrically functional solids which are finely divided particles of dielectric, conductor or resistor materials.

Suitable dielectric materials include dielectric solids such as alumina, titanates, zirconates and stannates. It is possible to use precursors of such materials, i.e., solid materials which upon firing are converted to dielectric solids, and to mixtures of any of these. Among the many dielectric solids which are likely to be used in the photosensitive layer are $BaTiO_3$, $CaTiO_3$, $SrTiO_3$, $PbTiO_3$, $BaZrO_3$, $CaSnO_3$, $BaSnO_3$, and $Al_2O_3$. As will be apparent to those skilled in the ceramic arts, the exact chemical composition of the dielectric solids to be used in the composition of the invention is not ordinarily critical in the rheological sense. It is also preferred that the dielectric solids not have swelling characteristics in the organic dispersion since the rheological properties of the dispersion may be substantially changed thereby.

Suitable conductor materials include finely divided particles of metals such as copper, gold, silver, platinum, palladium, nickel, zinc, and combinations and mixtures thereof.

Suitable resistor materials include finely divided particles of oxides of ruthenium, iridium, rhodium and osmium, particularly bismuth ruthenate and barium ruthenate, and combinations of silver, silver oxide, palladium and palladium oxide, as well as tin and tin/tantalum.

It had been found that there should not be a significant amount of functional solids having a particle size of less than 0.2 micrometer in order to obtain adequately complete volatilization of the organic medium when the films or layers thereof are fired to remove the organic medium and to effect sintering of the inorganic binder and the functional solids. However, none of the functional solids ordinarily will exceed 20 micrometers and, furthermore, it is preferred that at least 80 wt. % of the solids have a size of 1–10 micrometers. When the photosensitive material is a thick film paste, which is usually applied to the substrate by screen printing, the maximum particle size should not exceed the thickness of the screen. When the photosensitive material is used to make dry photosensitive film, the maximum particle size should not exceed the thickness of the film.

In addition, it is preferred that the surface area/weight ratio of the functional particles not exceed 10 $m^2/g$ for the reason that such particles tend to affect adversely the sintering characteristics of the accompanying inorganic binder. It is still further preferred that the surface area/weight ratio not exceed 5 $m^2/g$. Functional particles having a surface area/weight ratio of 1–5 have been found to be quite satisfactory.

For dielectric solids, a preferred particle size for d50, i.e., a point at which the number of smaller particles equals the number of larger particles, is in a range from 2.30–2.70 micrometers. This size range is preferred to achieve a blister free surface while maintaining a hermetic structure. This particle size range is similar to a preferred range for inorganic binder of glass frit, namely a range from 2.30–2.70 micrometers (d50).

A preferred dielectric material is alumina. A preferred procedure is to pass the milled water alumina slurry through a fine mesh screen (ex. 400 mesh) to remove large particles and also through a magnetic separator. The magnetic separator removes all magnetic conductive materials which otherwise would increase the conductivity of the final product. The alumina can also be freeze dried after milling.

5. Inorganic Binder

The inorganic binder is glass frit which aids in sintering the functional solids. It may be of any well known glass composition which has a melting temperature below that of the functional solids. It is preferred that the softening point of the inorganic binder be 550°–825° C. and still more preferably 575°–750° C. If melting takes place below 550° C., organic material will likely be encapsulated and blisters will tend to form in the layer as the organics decompose. On the other hand, a softening point above 800° C. will tend to produce a porous layer when sintering temperatures compatible with copper metallizations, e.g., 800°–900° C., are used.

The glass frits most preferably used are the borosilicate frits, such as lead borosilicate, bismuth, cadmium, barium, calcium or other alkaline earth borosilicates. The preparation of such glass frits is well known and consists, for example, in melting together the constituents of the glass in the form of the oxides of the constituents and pouring such molten composition into water to form the frit. The starting materials may also be glass precursors, i.e. compounds that will yield the desired oxides under the usual conditions of frit production.

Thereafter the frit is preferably processed in a similar manner as described above for the dielectric solids. The frit is passed through a fine mesh screen to remove large particles since the solid composition should be agglomerate free. It is preferred that the inorganic binder, like the dielectric solids, have a surface to weight ratio of no more than 10 m$^2$/g, and at least 90 wt. % of the particles preferably have a particle size of 1-10 micrometers.

For dielectric compositions, it is preferred that the d50 of the inorganic binder be equal to or less than that of the dielectric solids. For a given particle size dielectric solids, the inorganic binder/dielectric solids ratio required to achieve hermeticity will decrease as the inorganic binder size decreases. With a given dielectric solids-inorganic binder system, if the ratio of inorganic binder to dielectric solids is significantly higher than that required to achieve hermeticity, the dielectric layer tends to form blisters on firing. If the ratio is significantly lower, the fired dielectric will be porous and therefore nonhermetic.

Within the above-described particle size and surface area limits, it is nevertheless preferred that the inorganic binder particles be 0.5-6 micrometer. The reason for this is that smaller particles having a high surface area tend to adsorb the organic materials and thus impede clean decomposition. On the other hand, larger size particles tend to have poorer sintering characteristics. The inorganic binder is present in the amount of 10 to 70% by weight based on the total solids weight.

6. Organic Medium

The main purpose of the organic medium is to serve as a vehicle for dispersion of the finely divided functional and glass solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion.

When the dispersion is to be made into a film, the organic medium in which the functional solids and inorganic binder are dispersed consists of polymeric binder, monomer and initiator as discussed above, which are dissolved in a volatile organic solvent. Other optional components, discussed in more detail below, will be dispersed in the solvent as well. The solvent component of the organic medium, which may be a mixture of solvents, is chosen so as to obtain complete solution therein of the polymer and to be of sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Examples of suitable solvents include benzene, acetone, xylene, methanol, ethanol, methyl-ethyl ketone, 1,1,1-trichlorethane, tetrachlorethylene, amyl acetate, 2,2,4-triethyl pentanediol-1,3-monoisobutyrate, toluene, methylene chloride, and ethylene glycol monoalkyl and dialkyl ethers such as ethylene glycol mono-n-propyl ether. For casting films, methylene chloride is particularly preferred because of its volatility.

When the material is to be made into a film, it is preferred that the weight ratio of the inorganic solids (functional solids plus glass) to organics be within the range of 0.5 to 8.0; more preferably, form 1.0 to 6.0. The preferred ratio of inorganic solids to organics is dependent on the particle size of the inorganic solids, the organic components and on surface pretreatment of the inorganic solids. When the particles are treated with organosilane coupling agents, the ratio of inorganic solids to organics can be increased.

On the other hand, when the photosensitive material is to be applied as a thick film paste, conventional thick film organic media can be used with appropriate rheological adjustments and the use of lower volatility solvents. The thick film compositions will usually be applied to the substrate by means of screen printing. Therefore, they must have appropriate viscosity so that they can be passed through the screen readily. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

The organic medium for most thick film compositions is typically a solution of polymer in a solvent, in this case a solution of the polymeric binder, monomer and photoinitiator discussed above. The solvent usually is one which boils within the range of 130°-250° C. The most widely used solvents for thick film applications are terpenes such as alpha- or beta-terpineol or mixtures thereof with other solvents such as kerosene, dibutylphthalate, butyl carbitol, butyl carbitol acetate, hexamethylene glycol and high boiling alcohols and alcohol esters. Various combinations of these and other solvents are formulated to obtain the desired viscosity and volatility requirements for each application. The ratio of organic medium to inorganic solids in the thick film dispersions can vary considerably and depends upon the manner in which the dispersion is to be applied and the kind of organic medium used. Normally, to achieve good coverage, the dispersions will contain complementally by weight 50-90% solids and 50-10% organic medium. Such dispersions are usually of semiliquid consistency and are referred to commonly as "pastes".

7. Additional Additives

Frequently the photosensitive composition will also contain one or more plasticizers which serve to lower the T$_g$ of the binder. It is preferred to have a plasticizer present when the photosensitive composition is to be cast as a film. The plasticizers help to assure good lamination to the substrate, and enhance the developability of unexposed areas of the photosensitive layer. However, for electronic applications, the use of such materials should be kept to a minimum in order to reduce the amount of organic materials which must be removed when the films are fired. The choice of plasticizers is, of course, determined primarily by the polymer which is to be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate, triethyleneglycol diacetate and polyester plasticizers. Dibutyl phthalate is frequently used with acrylic polymer systems because it can be used effectively in relatively small concentrations.

The organic medium can also contain a dispersant to insure the efficient wetting of the inorganic by the organic polymers and monomers. It is preferred that a dispersant be added when the photosensitive material is formulated as a thick film paste for screen printing. For electronic applications, a thoroughly dispersed inorganic is desirable in the preparation of a photoactive paste with the needed characteristics of good screen printing and leveling and fire out characteristics. The dispersant enables the polymeric binder to associate or wet the inorganic solids, giving an agglomerate free system.

The dispersants of choice are the A-B dispersants generally described in "Use of A-B Block Polymers as Dispersants for Non-aqueous Coating Systems" by H. K. Jakubauskas, *Journal of Coating Technology*, Vol. 58; Number 736; Pages 71–82. Useful A-B dispersants are disclosed in U.S. Pat. Nos. 3,684,771, 3,788,996, 4,070,388 and 4,032,698 and U.K. Patent 1,339,930.

The dispersant is generally present in an amount of 0.1–5.0 percent by weight based on the total photohardenable composition.

The organic medium may include small amounts of other components, e.g., pigments, dyes, thermal polymerization inhibitors, adhesion promoters, such as organosilane coupling agents, coating aids such as polyethylene oxides, etc. so long as the photohardenable compositions retain their essential properties. Organosilanes are particularly useful for materials used in electronic applications and are generally present in quantities of 3.0 wt. % or less based on the weight of the inorganic particles. Treated particles have a lower demand for organics. Thus, the level of organics in the coating can be reduced, which results in easier volatilization upon firing.

C. Second Patterning Layer

The second patterning layer, which is nonphotosensitive, is applied over the photosensitive first layer. The patterning layer comprises (1) a radiation-opaque material, i.e., an agent which prevents the transmission of actinic radiation and (2) a diffusing agent which is capable of changing the dispersibility of the photosensitive layer in a predetermined eluant, both of which are dispersed in (3) an organic medium. It frequently will further comprise additional inorganic solids to provide the necessary rheological properties.

1. Radiation-Opaque Material

Almost any material which is opaque to radiation at the wavelength(s) at which the photoinitiator is sensitive can be used here. It must have sufficient opacity, i.e., optical density, to prevent photohardening of the photosensitive layer in the area immediately beneath the patterned layer. The material also must not interact chemically with the photosensitive layer. The radiation-opaque material should be removed completely in the development step, i.e., it should be dispersible in the developer solvent. The radiation-opaque material should also removed quickly by the developer solvent to facilitate the development of the underlying photosensitive first layer. In general, materials which are suitable as the radiation-opaque material will be pigments. In general, materials which are suitable as the radiation-opaque material will be pigments, such as, for example, carbon black, copper chromite, chromium oxides, cobalt chrome aluminate, and other dark inorganic pigments. Preferred pigments are those containing carbon black. The radiation-opaque material will generally comprise from 10–40% by weight of the patterning layer.

2. Diffusing Agent

The diffusing agent must be able to interact with the polymeric binder in the first photosensitive layer to increase the dispersibility of that first layer in the predetermined eluant. Thus the diffusing agent chosen for any given system will depend on the polymeric binder used in the first photosensitive layer.

When the polymeric binder is plasticizable, the diffusing agent is a plasticizer. Plasticizers for the types of polymeric binders discussed above are well known. Examples of suitable plasticizers include alkyl phthalates, alkyl phosphates, citrate esters, epoxy-type plasticizers, acetate and adipate esters and glycol esters. Other suitable plasticizers have been disclosed in Felten, U.S. Pat. No. 5,032,216.

The amount of plasticizer present in the patterning layer must be sufficient to provide an increase in dispersibility of the photosensitive first layer so that the first layer can be developed. In general, the plasticizer will be present in an amount of 1–20% by weight, based on the total weight of the patterning layer.

When the polymeric binder has salt-forming acidic groups, the diffusing agent is a base. It is preferred to use an organic base. The base can be either liquid or solid. When solid bases are used it is preferred that the melting points not exceed 120° C. Such materials include aliphatic amines, such as alkyl amines; aromatic amines, such as pyridine and morpholine; and alkanol amines, such as triethanolamine.

The amount of base present in the patterning layer must be sufficient to provide an increase in dispersibility of the photosensitive first layer so that the first layer can be developed. In general, the base will be present in an amount of 10–95% by weight, based on the total weight of the patterning layer.

When the polymeric binder is acid-degradable, the diffusing agent is an acid. Either inorganic or organic acids can be used. It is preferred that an organic acid be used. In general, the acid should have a $pK_a$ of less than 6. Examples of suitable acids include carboxylic acids, particularly substituted and unsubstituted acetic acids, sulfonic acids, nitric acid, sulfuric acid, and phosphoric acid.

The amount of acid present in the patterning layer must be sufficient to provide an increase in dispersibility of the photosensitive first layer so that the first layer can be developed. In general, the acid will be present in an amount of 10–95% by weight, based on the total weight of the patterning layer.

When the polymeric binder is emulsifiable, the preferred diffusing agent is a detergent. Examples of suitable detergents include aqueous solutions of anionic, cationic or nonionic surfactants. The amount of detergent present in the patterning layer must be sufficient to provide an increase in dispersibility of the photosensitive first layer so that the first layer can be developed. In general, the detergent will be present in an amount of 10–90% by weight, based on the total weight of the patterning layer.

When the polymeric binder is susceptible to catalytic decomposition, the diffusing agent is a catalyst. In most cases the catalyst will be the salt or a complex of a heavy metal such as platinum, palladium or rhodium. The metal salts or complexes which can be used are those which are able to diffuse or migrate to the underlying first photosensitive layer, such as platinum acetylacetonate. The amount of catalyst present in the patterning layer must be sufficient to provide an increase in dispersibility of the photosensitive first layer so that the first layer can be developed. In general, the catalyst will be present in an amount of 1-20% by weight, based on the total weight of the patterning layer.

3. Organic Medium

The primary function of the organic medium is to facilitate the application of the radiation-opaque material and the diffusing agent to the first photosensitive layer in the desired pattern. Thus the medium must first be one in which those materials and any additional solids are dispersible with an adequate degree of stability. Secondly, the rheological properties of the organic medium must be such that they lend good application properties to the dispersion. For example, the desired viscosity for applying the patterning material by screen printing is different than that desired for ink jet printing.

The organic medium generally comprises an organic solvent or mixture of solvents. The solvent should be of sufficiently high volatility to be evaporated from the dispersion by the application of relatively low levels of heat at atmospheric pressure. In addition, the solvent must boil well below the boiling point and decomposition temperature of any other additives contained in the organic medium. Examples of suitable solvents include terpenes such as alpha- or beta-terpineol or mixtures thereof with other solvents such as kerosene, dibutylphthalate, butyl Carbitol, butyl Carbitol acetate, hexamethylene glycol and high boiling alcohols and alcohol esters. Various combinations of these and other solvents are formulated to obtain the desired viscosity and volatility requirements for each application.

The patterning layer can also contain additional inorganic solids in order to obtain the level of solids necessary for good application characteristics. When the patterning layer is applied by screen printing, it is preferred that additional inorganic solids be present in order to obtain the appropriate rheological properties. The inorganic solids should be essentially inert and should be dispersible in the organic medium. Suitable inorganic solids include the dielectric solids and inorganic binders discussed above. A preferred inorganic solid for screen printing is alumina.

The organic medium can additionally comprise organic polymeric binders, plasticizers, dispersants, and other additives such as those described above for the photosensitive layer. It is preferred that the organic medium include a plasticizer to facilitate the diffusing of the diffusing agent to the photosensitive first layer.

The ratio of organic medium to radiation-opaque material and other inorganic solids can vary considerably and depends upon the manner in which the pattern layer is to be applied and the kind of organic medium used. Normally, to achieve good coverage, the dispersions will contain complementally by weight 40-90% solids and 60-10% organic medium.

EXAMPLES

In the following examples all parts and percentages are by weight unless otherwise indicated.

| I. Materials | |
|---|---|
| AB-I: | A-B Dispersant |
| Alumina I: | 98.23% alumina, 1.77% cobalt aluminate which has been passed through a magnetic separator and freeze dried; d50 of 2.3-2.7 micrometers |
| Alumina II: | 100% alumina which has been passed through a magnetic separator and freeze dried; d50 of 2.3-2.7 micrometers. |
| Binder I: | Copolymer of 75% methylmethacrylate and 25% methacrylic acid; MW = 7000, Tg = 160° C., Acid No. = 160 |
| Binder II: | Amphomer, National Starch Co. (Bridgewater, NJ) |
| Binder III: | High molecular weight polymethyl methacrylate with 2-3% methacrylic acid |
| Ceramic I: | Calcium zirconate which has been passed through a magnetic separator and freeze dried; particle size = 2-6 micrometer |
| Ceramic II: | cobalt chrome aluminate which has been passed through a magnetic separator and freeze dried particle size = 2-6 micrometer |
| Ceramic III: | Zirconium silicate; particle size 2-6 micrometer |
| Ceramic IV: | Cobalt aluminate; particle size 2-6 micrometer |
| Ceramic V: | Finely divided quartz |
| Frit I: | 35.37% $SiO_2$; 5.99% BiO; 18.00% CuO; 36.54% ZnO; 2.39% $ZrO_2$; 1.71% $Al_2(PO_4)_3$; d50 of 2.2-3.0 micrometers |
| Frit II: | 46.00% $SiO_2$; 2.40% $ZrO_2$; 5.50% $Al_2O_3$; 10.82% SrO; 6.70% CaO; 16.00% ZnO; 12.56% BaO; d50 of 2.2-3.0 micrometers |
| Frit III: | 47.46% SiO2; 11.78% BaO; 6.90% $Al_2O_3$; 10.15% SrO; 21.29% ZnO; 2.42% $ZrO_2$; d50 of 2.2-3.0 micrometers |
| Frit IV: | 57.22% $SiO_2$; 4.51% $B_2O_3$; 8.85% $Al_2O_3$; 17.00% PbO; 7.55% CaO; 2.45% $Na_2O$; 1.60% $K_2O$; 0.82 MgO; d50 of 2.2-3.0 micrometers |
| Initiator I: | Benzoin methyl ether |
| Initiator II: | Xanthone |
| Initiator III: | Benzoin |
| Initiator IV: | 4-Benzyl-4'-methyldiphenyl sulfide; Quantacure BMS, made by International Bio-synthetics Ltd. (Cheshire, UK) |
| Initiator V: | (4-Benzoylbenzyl) trimethylammonium chloride; Quantacure BTC, made by International Bio-synthetics Ltd. (Cheshire, UK) |
| Initiator VI: | 2,2-Dimethoxy-2-phenyl acetophenone |
| Initiator VII: | Isopropylthioxanthone (2 and 4 isomer); Quantacure ITX, made by International Bio-synthetics Ltd. (Cheshire, UK) |
| Initiator VIII: | Ethyl-4-(dimethylamino)benzoate; Quantacure EPD, made by International Bio-synthetics Ltd. (Cheshire, UK) |
| Initiator IX: | Benzophenone |
| Initiator X: | Michler's ketone |
| Monomer I: | Polyoxyethylated trimethylolpropane triacrylate; MW = 1162 |
| Monomer II: | Trimethylolpropane triacrylate |
| Pigment I: | Drakenfield 1795 black pigment made by Ciba-Geigy Corp. (Hawthorn, NY) |
| Pigment II: | Pt powder, particle size = 2-6 micrometer |
| Pigment III: | Cobalt chrome aluminate, particle size = 2-6 micrometer |
| Plasticizer: | Butylbenzylphthalate |
| Solvent I: | 13% ethyl cellulose, 38% dimethyl phthalate, 11% Dowanol PPH (Dow Chemical, Midland, MI), 38% 2,2,4-trimethylpentane-1,3-diol monoisobutyrate |
| Solvent II: | Beta-terpineol |
| Stabilizer: | 2,6-di-t-butyl-4-methylphenol |
| TEA: | Triethanol amine |

II. Preparation of Photosensitive Dielectric Material

A. Vehicle Mixtures

Mixtures of initiator, stabilizer, binder, plasticizer and solvent were prepared and are herein referred to as the "vehicle". For the comparative examples the initiator and stabilizer are omitted.

Solvent and organic polymeric binder were mixed and heated with stirring to 135° C. Heating and stirring was continued until all the binder had dissolved. The solution was then cooled to 100° C. and the initiator and stabilizer added. This mixture was then stirred at 100° C. until the solids had dissolved.

B. Paste Formulation

The dielectric paste was prepared by mixing the monomer and dispersant, if present, with the mixture from A above. In the comparative examples, the monomer was omitted. The glass frit and dielectric solids were then added and mixing was continued for 30 minutes. This was then aged for approximately 12 hours and then roll milled using a three roll mill, at a roll pressure of 400 psi. The paste was then screened through a 400 mesh screen. The paste viscosity at this point was adjusted by the addition of beta-terpineol to 80–120 poise, which is optimum for screen printing.

III. Preparation of Patterning Material

The patterning material was prepared by mixing the solvent diffusing agent and other organic materials (binder, dispersant, etc.) at room temperature. To this was added the inorganic binder and pigment. This was mixed using a roll mill.

IV. Process Conditions

The dielectric paste was applied to an alumina ceramic substrate by screen printing using a 200 mesh screen to a wet thickness of 50 micrometers. This was dried at 75° C. in air for 15 minutes resulting in a 25 micrometer dry thickness. The printing and drying steps were repeated to produce a total thickness of 50 micrometers.

The patterning material was applied to the dried dielectric layer by screen printing using a 400 mesh patterned screen to a wet thickness of 20 micrometers. This was dried at 75° C. in air for 10 minutes to effect diffusion of the diffusing agent to the first photosensitive layer.

The assembly from above was then exposed using a mercury-xenon lamp with an intensity of 15–25 mwatts/cm$^2$ for the amount of time shown below. The exposed parts were developed using a Du Pont ADS-24 Processor (E. I. du Pont de Nemours & Co., Wilmington, Del.) containing water as eluant. Development was carried out at 85° F. (30° C.) for 30 seconds.

The developed parts were dried in a forced draft oven at 75° C. for 15 minutes and fired in air in a furnace with a peak temperature of 900° C. over a two-hour cycle.

EXAMPLES 1–7

These examples illustrate the process of the invention using a binder in the photosensitive first layer which has acidic groups, and a diffusing agent in the patterning layer which is basic. The examples also illustrate the use of different photoinitiators. In Examples 1–6, the initiators are those which absorb at less than 350 nm.

In addition to the procedure described above, unexposed parts were exposed to normal fluorescent room light for the times shown below and examined for signs of photohardening or fogging in the photosensitive layer.

The dielectric layer had the composition shown in Table 1 using the vehicle mixtures given in Table 2. The exposure times and results are summarized below in Table 4.

TABLE 1

| Photosensitive Dielectric Composition | |
| --- | --- |
| Component | Parts |
| Frit | 52.0 |
| Ceramic I | 2.70 |
| Ceramic II | 0.30 |
| Vehicle Mixture (Table 2) | 31.00 |
| Monomer I | 8.48 |
| Monomer II | 2.12 |
| AB-I | 2.10 |
| Solvent II | 3.00 |

TABLE 2

| | Vehicle Mixture | | | | | | |
| --- | --- | --- | --- | --- | --- | --- | --- |
| Component | 1 | 2 | 3 | 4 | 5 | 6 | 7 |
| Binder I | 40.0 | 40.0 | 40.0 | 40.0 | 40.0 | 40.0 | 40.0 |
| Solvent II | 58.7 | 57.7 | 58.7 | 57.7 | 58.7 | 58.7 | 54.9 |
| Stabilizer | 0.3 | 0.3 | 0.3 | 0.3 | 0.3 | 0.3 | 0.3 |
| Initiator I | 1.0 | — | — | — | — | — | — |
| Initiator II | — | 2.0 | 1.0 | 1.0 | — | — | — |
| Initiator III | — | — | — | 1.0 | — | — | — |
| Initiator IV | — | — | — | — | 2.0 | — | — |
| Initiator V | — | — | — | — | — | 2.0 | — |
| Initiator IX | — | — | — | — | — | — | 4.00 |
| Initiator X | — | — | — | — | — | — | 0.80 |

A patterning layer was prepared with the composition given in Table 3.

TABLE 3

| Patterning Layer Composition | |
| --- | --- |
| Component | Parts |
| TEA (Diffusing Agent) | 10.00 |
| Plasticizer | 20.00 |
| Alumina I | 45.00 |
| Pigment I | 15.00 |
| Solvent I | 5.00 |
| Solvent II | 5.00 |

TABLE 4

| | | Results | | |
| --- | --- | --- | --- | --- |
| Example | Imaging* Exposure | Smallest Via** | Fluorescent Exposure*** | Dielectric Layer |
| 1 | 4 | 5 | 36 | No Fog |
| 2 | 4 | 6 | 12 | No Fog |
| 3 | 8 | 5 | 12 | No Fog |
| 4 | 8 | 4 | 12 | No Fog |
| 5 | 8 | 5 | 36 | No Fog |
| 6 | 4 | 5 | 36 | No Fog |
| 7 | 1–2 | 5 | 36 | Polymerized |

*Exposure to mercury xenon lamp, in seconds
**Mils (0.0025 cm)
***Exposure to fluorescent light, in hours The results show the excellent resolution of all the dielectric layers prepared according to the process of the invention. In addition, it can be seen that using the initiators of Examples 1–6 results in a photosensitive layer with excellent white light stability. It should be noted, however, that the invention can be practiced with good results using the composition of Example 7 so long as adequate precautions are taken to avoid exposure of the photosensitive material to room light during processing, i.e., yellow light conditions are maintained.

EXAMPLES 8-12

These examples illustrate the process of the invention using different photosensitive paste compositions and different patterning compositions. In addition, these examples illustrate the effect of exposure time on the size of vias formed in the photosensitive layer. For comparison, nonphotosensitive pastes were also formulated. Both photosensitive and nonphotosensitive pastes were prepared as described above. The photosensitive compositions were exposed for the times given below. The compositions and results are given in Tables 5-10.

TABLE 5

| Component | Vehicle I | II | III | IV |
|---|---|---|---|---|
| Binder I | 25.00 | 25.00 | 25.00 | — |
| Binder III | 3.00 | 3.00 | 3.00 | — |
| Plasticizer | 40.00 | 40.00 | 40.00 | 46.5 |
| Solvent II | 26.90 | 25.20 | 32.00 | 46.5 |
| Stabilizer | 0.30 | 0.30 | — | — |
| Ethyl Cellulose | — | — | — | 7.0 |
| Initiator VI | — | 3.00 | — | — |
| Initiator VII | — | 1.00 | — | — |
| Initiator VIII | — | 2.50 | — | — |
| Initiator IX | 4.00 | — | — | — |
| Initiator X | 0.80 | — | — | — |

TABLE 6

| | Paste Compositions | | | | | | |
|---|---|---|---|---|---|---|---|
| | Examples | | | | | Comparative | |
| Component | 8 | 9 | 10 | 11 | 12 | A | B |
| Frit II | 30.92 | 30.92 | — | 30.92 | — | 30.92 | — |
| Frit III | 20.62 | 20.62 | — | 20.62 | — | 20.62 | — |
| Frit IV | — | — | 35.24 | — | 35.24 | — | 35.24 |
| Alumina II | 4.28 | 4.28 | 22.48 | 4.28 | 22.48 | 4.28 | 22.48 |
| Ceramic III | 5.72 | 5.72 | — | 5.72 | — | 5.72 | — |
| Ceramic IV | 1.96 | 1.96 | 1.27 | 1.96 | 1.27 | 1.96 | 1.27 |
| Ceramic V | — | — | 4.51 | — | 4.51 | — | 4.51 |
| Vehicle I | 27.50 | 27.50 | — | 27.50 | — | — | — |
| Vehicle II | — | — | 27.50 | — | 27.50 | — | — |
| Vehicle III | — | — | — | — | — | 27.50 | 27.50 |
| Monomer I | 5.60 | 5.60 | 5.60 | 5.60 | 5.60 | — | — |
| Monomer II | 1.40 | 1.40 | 1.40 | 1.40 | 1.40 | — | — |
| Plasticizer | — | — | — | — | — | 3.50 | 3.50 |
| Solvent II | 2.00 | 2.00 | 2.00 | 2.00 | 2.00 | 5.50 | 5.50 |

TABLE 7

| | Patterning Layer Compositions | | | |
|---|---|---|---|---|
| | Examples | | | Comparative |
| Component | 8 & 10 | 9 | 11 & 12 | A & B |
| Alumina I | 56.6 | 56.6 | 51.6 | 61.6 |
| Pigment II | 5.0 | 10.0 | — | — |
| Pigment II | — | — | 10.0 | — |
| Vehicle IV | 20.3 | 20.3 | 20.3 | 20.3 |
| TEA (Diffusing Agent) | 15.2 | 15.2 | 15.2 | 15.2 |
| Solvent II | 2.9 | 2.9 | 2.9 | 2.9 |

TABLE 8

| | Results | | |
|---|---|---|---|
| | Exposure | Via Diameter (mils) | |
| Sample | Time (sec) | Top | Bottom |
| Pattern Dot = 4.2 mil | | | |
| Comparative A (Diffusion only) | — | 5.8 | 2.3–3.1 |
| 8 | 0 | 6.1 | 4.2 |
| 8 | 0.5 | 4.2 | 4.2 |
| 8 | 1.0 | 3.8 | 3.8 |
| 8 | 2.0 | 3.1 | 3.1 |
| 8 | 4.0 | 1.5 | 1.5 |
| 9 | 0 | 6.1 | 4.2 |
| 9 | 0.5 | 3.8 | 3.8 |
| 9 | 1.0 | 3.8 | 3.8 |
| 9 | 2.0 | 3.0 | 3.0 |
| 9 | 3.0 | 2.7 | 2.7 |
| 9 | 4.0 | 2.3 | 2.0 |

The results show that an exposure of about 0.5 seconds for Example 8 and an exposure of about 0.5 to 1.0 seconds for Example 9 results in optimum vias. The vias resulting from these exposure times are the same size as the pattern dot or slightly smaller. The size of the via is approximately the same on the top and the bottom. The via in Comparative Example A, however, is larger than the pattern dot. It also is considerably larger on the top than on the bottom.

TABLE 9

| | Results | | |
|---|---|---|---|
| | Exposure | Via Diameter (mils) | |
| Sample | Time (sec) | Top | Bottom |
| Pattern Dot = 3.8 mil | | | |
| Comparative A (Diffusion only) | — | 5.0 | 4.2 |
| 10 | 0 | 4.6 | 4.2 |
| 10 | 0.2 | 3.8 | 2.7 |
| 10 | 0.5 | 2.3 | 1.2 |
| 10 | 1.0 | Some vias are plugged | |

The results, with the faster initiator of this example, show that an exposure of about 0.2 seconds results in optimum vias. The vias resulting from these exposure times are the same size as the pattern dot or slightly smaller and approximately the same on the top and the bottom.

TABLE 10

| | Results | | |
|---|---|---|---|
| | Exposure | Via Diameter (mils) | |
| Sample | Time (sec) | Top | Bottom |
| Pattern Dot = 4.2 mil | | | |
| Comparative A | — | 5.8 | 3.1 |
| Comparative B | — | 6.2 | 3.5 |
| Example 11 | 0.1 | 5.8 | 4.6 |
| | 0.5 | 5.0 | 3.8 |
| | 1.0 | 4.2 | 4.2 |
| | 2.0 | 3.8 | 3.8 |
| | 3.0 | 3.1 | 3.1 |
| | 4.0 | 2.7 | 1.2 |
| Example 12 | 0.1 | 4.2 | 3.5 |
| | 0.2 | 3.8 | 3.5 |
| | 0.3 | 3.8 | 3.1 |
| | 0.4 | 3.5 | 3.1 |
| | 0.5 | 3.5 | 2.7 |
| | 0.7 | Some vias are plugged | |

The results show that an exposure of about 1.0 seconds for Example 11 and an exposure of about 0.1 to 0.2 seconds for Example 12 results in optimum vias. The vias resulting from these exposure times are the same size as the pattern dot or slightly smaller. The size of the via is approximately the same on the top and the bottom.

These results show that the compositions of the invention, in which the first layer is photosensitive, result in vias having a size which more closely relates to the size of the pattern dot, vias which have the same size or are smaller than the pattern dot, and vias in which the size of the top opening and the size of the bottom opening are more closely matched. In addition, it can be seen that the size of the via can be controlled to a certain extent by varying the exposure times.

EXAMPLE 13

This example illustrates the effect of the order in which the processing steps are carried out, i.e., exposure before or after diffusion.

The dielectric, patterning and vehicle compositions are given in the tables below.

TABLE 11

| Dielectric Compositions | |
|---|---|
| Component | Parts |
| Frit I | 52.00 |
| Ceramic III | 2.70 |
| Ceramic II | 0.30 |
| Vehicle (Table 12) | 31.00 |
| Monomer I | 8.48 |
| Monomer II | 2.12 |
| AB-1 | 2.10 |
| Solvent II | 1.30 |

TABLE 12

| Vehicle Composition | |
|---|---|
| Component | Parts |
| Binder I | 40.00 |
| Solvent II | 54.90 |
| Initiator IX | 4.00 |
| Initiator X | 0.80 |
| Stabilizer | 0.30 |

TABLE 13

| Patterning Composition | |
|---|---|
| Component | Parts |
| Dimethyl phthalate | 20.00 |
| TEA | 10.00 |
| Solvent I | 5.00 |
| Alumina I | 55.00 |
| Pigment I | 5.00 |
| Solvent II | 5.00 |

The dielectric layer was prepared and applied as described above.

In one sample diffusion was effected first, followed by exposure to actinic radiation. The patterning material was applied to the dried dielectric layer by screen printing. The patterning layer was then caused to diffuse to the dielectric layer by heating the sample for 10 minutes at 90° C. The sample was then exposed to UV radiation for 0.5 seconds, developed and fired as described above. The ratio of the via size to the patterned dot size was 0.73.

In a second sample, the photosensitive layer was exposed to actinic radiation prior to effecting diffusion. The patterning material was applied to the dried dielectric layer by screen printing and, before drying, was exposed to UV radiation for 0.5 seconds. This was followed by the diffusion step, which was carried out by heating for ten minutes at 90° C. The part was developed and fired as described above. The ratio of via size to dot size was 0.63.

The example shows that the order in which the exposure and diffusion steps are carried out is not critical. In both cases a via smaller than the patterning dot can be achieved and with very similar resolution.

What is claimed is:

1. A method for making patterns in organic polymer films comprising the following steps:
   (a) applying to a substrate an unpatterned photosensitive first layer comprising (a1) an organic polymeric binder, (a2) an ethylenically unsaturated monomer and (a3) a photoinitiating system;
   (b) applying to the photosensitive first layer a second patterning layer comprising (b1) radiation-opaque material which prevents the transmission of actinic radiation and (b2) a diffusing agent which is capable of changing the dispersibility of the photosensitive material in a predetermined eluant;
   (c) exposing the first photosensitive layer to actinic radiation to effect photohardening of the photosensitive first layer in those areas not covered by the second patterning layer;
   (d) effecting patterned diffusion of the diffusing agent into the underlying first photosensitive layer; and
   (e) removing the areas of the first photosensitive layer which are dispersible in the predetermined eluant, by washing them with the eluant; wherein step (c) is carried out before, after or simultaneously with step (d).

2. The method of claim 1 wherein the diffusing agent, (b2), is a plasticizer capable of plasticizing the organic polymeric binder, (a1).

3. The method of claim 1 wherein the organic polymeric binder, (a1), contains acidic groups, and the diffusing agent, (b2), is a base.

4. The method of claim 3 wherein the organic polymeric binder is a copolymer of an ethylenically unsaturated acid and the base is an amine, and further wherein the ethylencially unsaturated acid is present at a level of at least 10% by weight of the copolymer.

5. The method of claim 4 wherein the ethylenically unsaturated acid is selected from the group consisting of acrylic acid and methacrylic acid.

6. The method of claim 1 wherein the organic polymeric binder, (a1), comprises acid degradable groups, and the diffusing agent, (b2), is an acid.

7. The method of claim 1 wherein the diffusing agent, (b2), is a detergent capable of dispersing the organic polymeric binder, (a1).

8. The method of claim 1 wherein the diffusing agent, (b2), is a catalyst for the decomposition of the organic polymeric binder, (a1).

9. The method of claim 1 wherein the radiation-opaque material, (b1), is a pigment.

10. The method of claim 1 wherein step (d) is carried out by heating the layer.

11. The method of claim 1 wherein step (e) is carried out by washing the layers with a solvent capable of dispersing both (i) the underlying areas of the first photosensitive layer into which the diffusing agent has diffused and (ii) the second patterning layer, to effect simultaneous removal of the second patterning layer and the underlying patterned areas of the first photosensitive layer.

12. The method of claim 1 wherein the photosensitive first layer further comprises (a4) finely divided particles of electrically functional solids.

13. The method of claim 12 which further comprises the step:
   (f) heating the substrate and the remaining polymerized areas of the first layer from step (e) to a temperature sufficient to effect volatilization of the organic components and to effect sintering of the electrically functional solids.

14. The method of claim 13 wherein the photosensitive first layer further comprises (a5) finely divided particles of inorganic binder having a softening point in the range from 550° to 825° C.

15. The method of claim 14 wherein the photosensitive layer is applied to the substrate as a film and the ratio of [(a4)+(a5)] to [(a1)+(a2)+(a3)] is in the range of 2.0 to 6.0.

16. The method of claim 14 wherein the photosensitive layer is applied to the substrate as a thick film paste and the ratio of [(a4)+(a5)] to [(a1)+(a2)+(a3)] is in the range of 1.0 to 9.0.

17. The process of claim 1 wherein the second patterning layer further comprises (b3) finely divided inorganic solids.

18. The process of claim 17 wherein the inorganic solids are alumina.

* * * * *